United States Patent
Liang (10) Patent No.: US 6,776,345 B1
(45) Date of Patent: Aug. 17, 2004

(54) MULTIFUNCTIONAL EXTRACTABLE CARD READING MODULAR CARTRIDGE CONNECTABLE TO WIRELESS BROADBAND NETWORK ROUTER

(76) Inventor: Hsieh-Rong Liang, 235 P.O. Box 10-69, Chung-Ho Taipei (TW)

( * ) Notice: Subject to any disclaimer, the term of this patent is extended or adjusted under 35 U.S.C. 154(b) by 0 days.

(21) Appl. No.: 10/395,412

(22) Filed: Mar. 25, 2003

(51) Int. Cl.$^7$ ................................................ G06K 7/00
(52) U.S. Cl. ...................... 235/486; 235/441; 361/727; 361/684; 361/686; 361/725; 361/724
(58) Field of Search ................................ 235/486, 441; 361/727, 684, 686, 725, 724

(56) References Cited

U.S. PATENT DOCUMENTS

| | | | |
|---|---|---|---|
| 5,694,291 A | * 12/1997 | Feightner | ..................... 361/683 |
| 5,739,515 A | * 4/1998 | Takemura | ..................... 235/441 |
| 6,078,504 A | * 6/2000 | Miles | ......................... 361/727 |
| 6,435,409 B1 | * 8/2002 | Hu | ............................. 235/441 |

OTHER PUBLICATIONS

Lam et al. US PG–Pub 2003/0142683 A1. Jul. 31, 2003.*
WEBPAGE—UPSTracking—2pages—http://wwwups.com/tracking/tracking.html.

* cited by examiner

Primary Examiner—Karl D. Frech
Assistant Examiner—Daniel A. Hess (57) ABSTRACT

A multifunctional extractable card reading modular cartridge connectable to a wireless broad band network router comprises an adapter box; an extractable wide band router modular cartridge installed in the adapter box and having two connecting terminals. The two connecting terminals of the extractable wide band router modular cartridge are capable of being electrically connected to two connecting ports of a wireless extractable card reading route. A front end of adapter box further has a USB port and an IEEE 1394 port for connecting other external devices; the USB port and the IEEE 1394 port are extended into the extractable wide band router modular cartridge in the adapter box; and a rear end of the adapter box 2 is installed with a 2×5 port 21 and an IEEE 1394 port 22 for connecting external devices.

5 Claims, 11 Drawing Sheets

MULTIFUNCTIONAL EXTRACTABLE CARD READING MODULAR CARTRIDGE CONNECTABLE TO WIRELESS BROADBAND NETWORK ROUTER

FIELD OF THE INVENTION

The present invention relates to routers, and particularly to a multifunctional extractable card reading modular cartridge connectable to a wireless broadband network router.

BACKGROUND OF THE INVENTION

With the improvement of wireless network communication, technologies about routers are advanced greatly. However the functions of prior art wireless network routers are confined so that they cannot match the current applications. For example, in generally, the router is installed with a cartridge so as to be fixed to the components of the cartridges and thus it is not suited to be as a portable device. Moreover, the prior art router are used with finite interfaces, such as IEEE802.11A, IEEE802.11B, IEEE802.11G standard interface communication protocols.

Thereby there are eager demands for supplying a router which can be interfaced with more interface cards.

SUMMARY OF THE INVENTION

Accordingly, the primary object of the present invention is to provide a multifunctional extractable card reading modular cartridge connectable to a wireless broad band network router comprises an adapter box; an extractable wide band router modular cartridge installed in the adapter box has two connecting terminals; the two connecting terminals of the extractable wide band router modular cartridge capable of being electrically connected to two connecting ports of a wireless extractable card reading route. A front end of adapter box further having a USB port and an IEEE 1394 port for connecting other external devices; the USB port 32 and the IEEE 1394 port 33 being extended into the extractable wide band router modular cartridge in the adapter box; and a rear end of the adapter box 2 is installed with a 2×5 port 21 an IEEE 1394 port 22 for connecting external devices.

The various objects and advantages of the present invention will be more readily understood from the following detailed description when read in conjunction with the appended drawing.

DETAILED DESCRIPTION OF THE PREFERRED EMBODIMENTS

Figure 1:
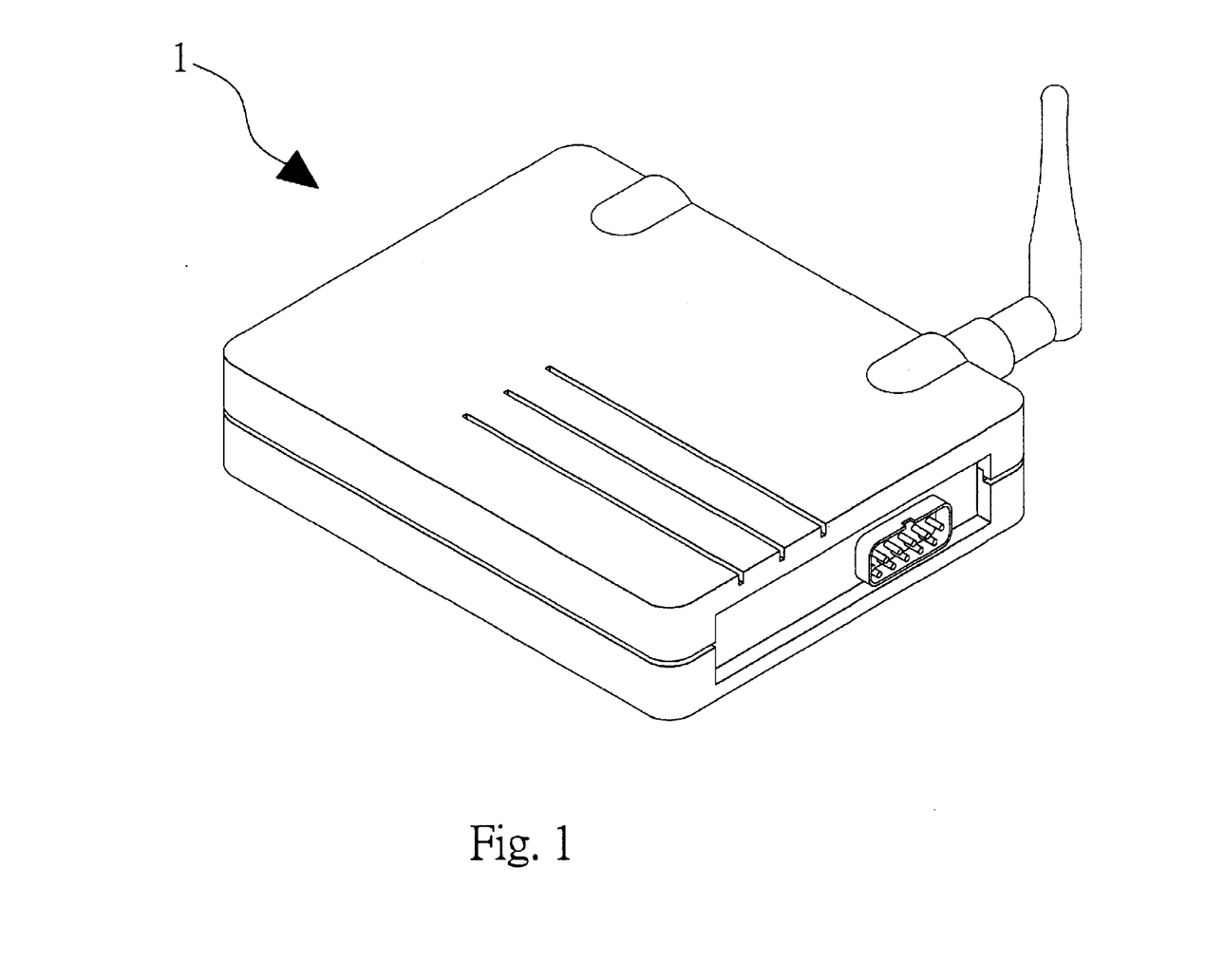
FIG. 1 is a schematic view showing a prior art wireless wide band network router.
Figure 2:
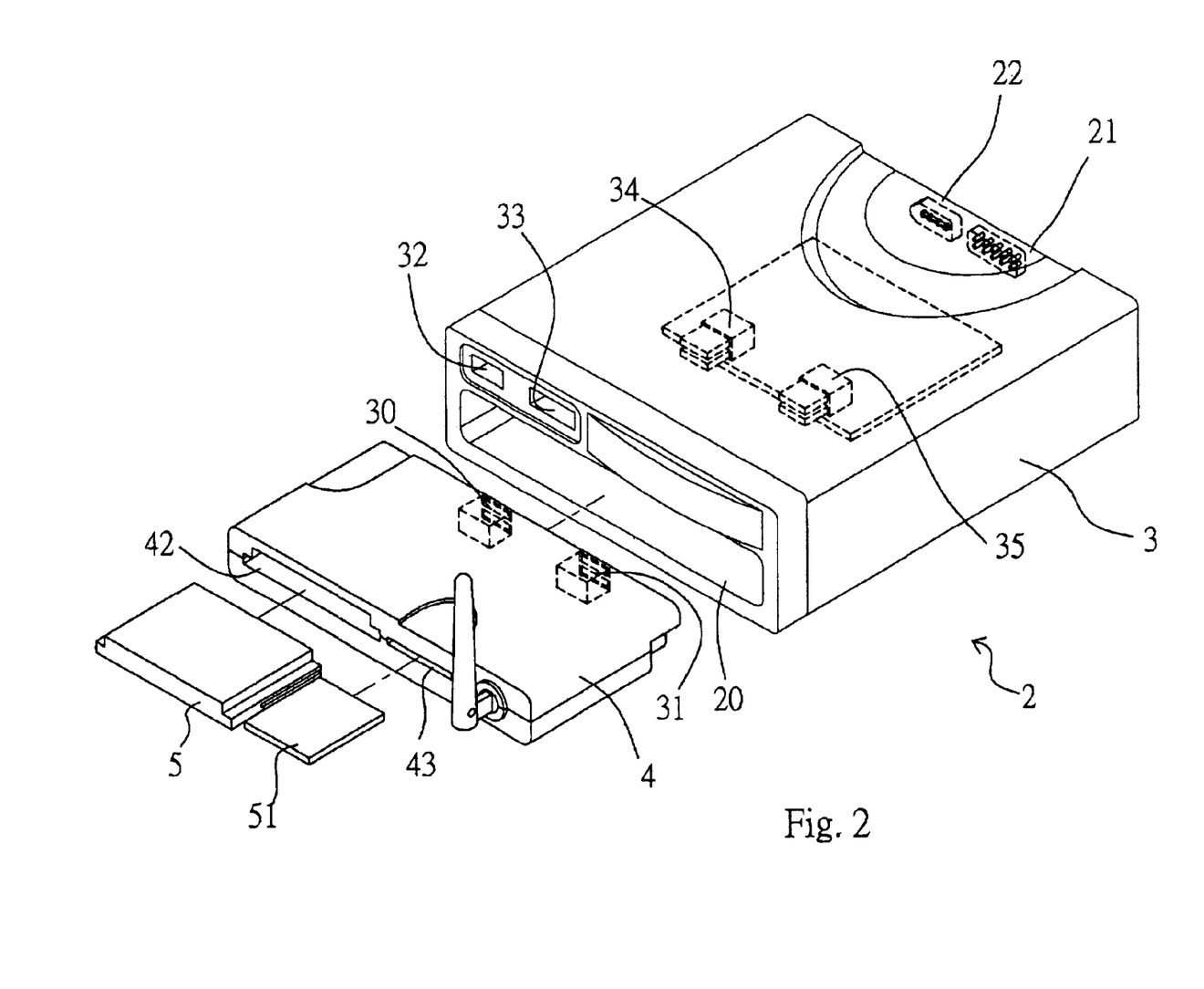
FIG. 2 is an exploded perspective view showing the extractable wide band router modular cartridge and wireless extractable card reading router of the present invention.
Figure 3:
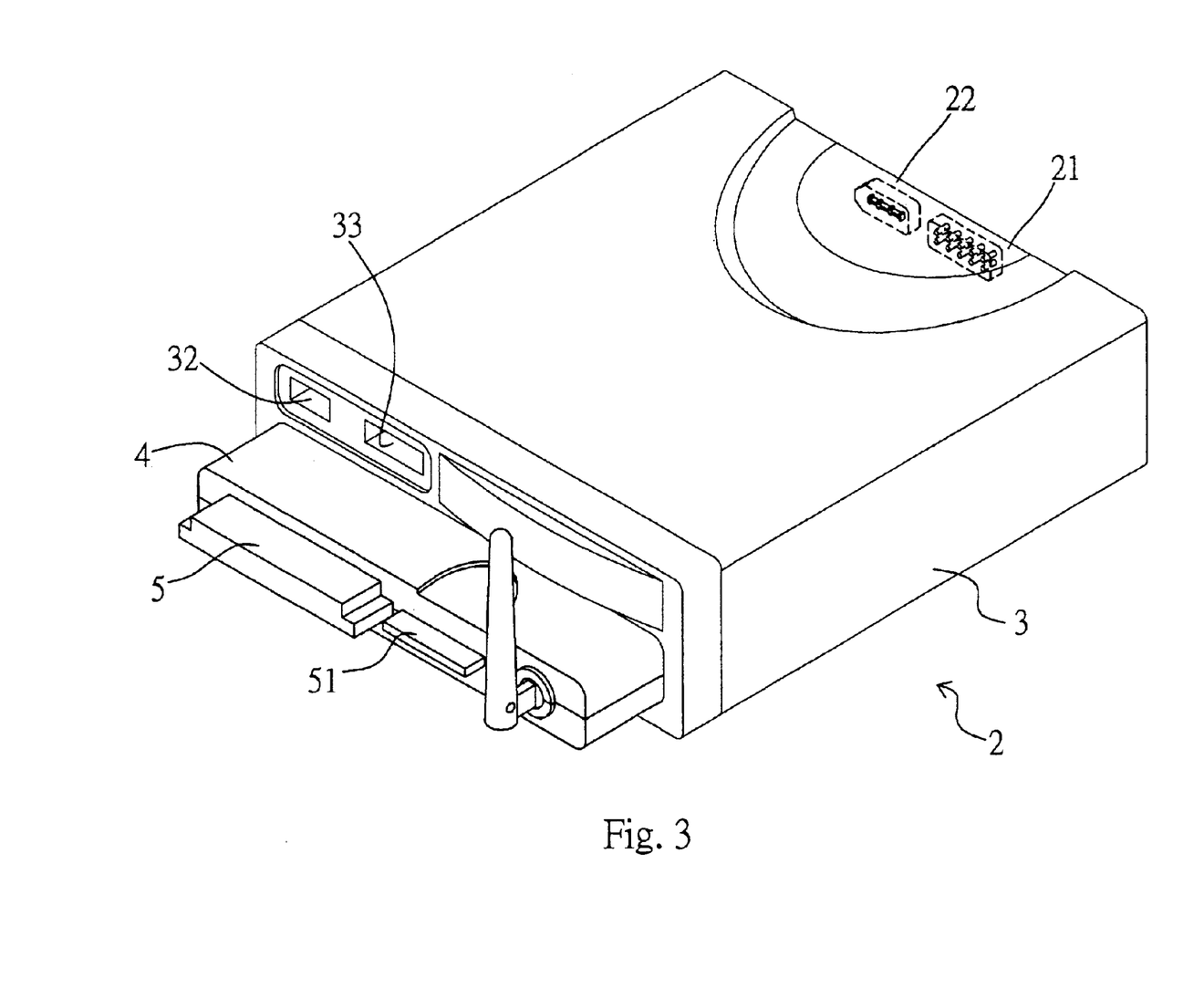
FIG. 3 is an assembled schematic view of the wireless extractable card reading router and extractable wide band router modular cartridge according to the present invention.

Referring to FIGS. 2 and 3, a multifunctional extractable card reading modular cartridge connectable to a wireless broad band network router according to the present invention comprises the following elements.

An adapter box for containing the elements of the present invention.

An extractable wide band router modular cartridge 3 is installed in the adapter box and has connecting terminals 34, 35.

A wireless extractable card reading router 4 has a connecting port 40 and a connecting port 41 at a distal end thereof. The communication protocols of the connecting ports 40 and 41 are high speed transmission USB transmission interface. A front end of the wireless extractable card reading router 4 has slot 42 and slot 43 for being inserted by a memory card 5 and a memory card 51, respectively. The memory cards used can be one of XD(Extreme Dgital)cards, CF(CompactFlash) cards, MD(IBM, Microdrive) cards, SM(SmartMedia) cards, MS(MemoryStick) cards, SD(SecureDigital) cards, MMC(MultiMediaCard) cards, etc.

The connecting terminals 34, 35 of the extractable wide band router modular cartridge are electrically connected to the connecting ports 40 and 41, respectively. Thereby when the wireless extractable card reading router 4 is inserted into the extractable wide band router modular cartridge 3, the data in the memory cards 5 and 51 is transferred through the wireless extractable card reading router 4 and the extractable wide band router modular cartridge 3. Thereby the wireless extractable card reading router and extractable wide band router modular cartridge 3 are separable.

Figure 5:
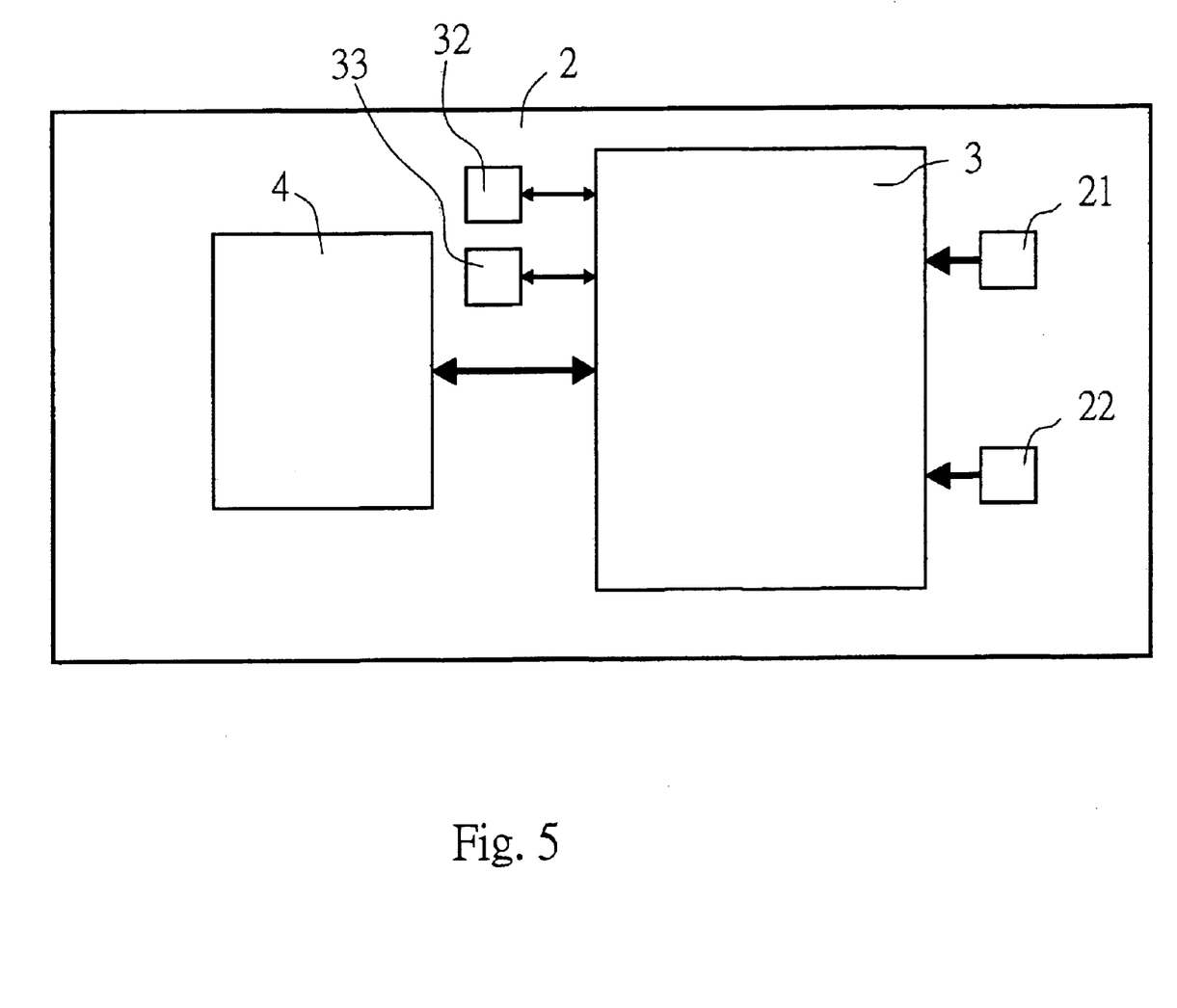
FIG. 5 shows the connection of the adapter box with two external ports.

Referring to FIGS. 2 and 5, a front end of adapter box 2 is further with a USB port 32 and an IEEE 1394 port 33 for connecting respective devices. The USB port 32 and the IEEE 1394 port 33 are extended into the extractable wide band router modular cartridge 3.

Figure 4:
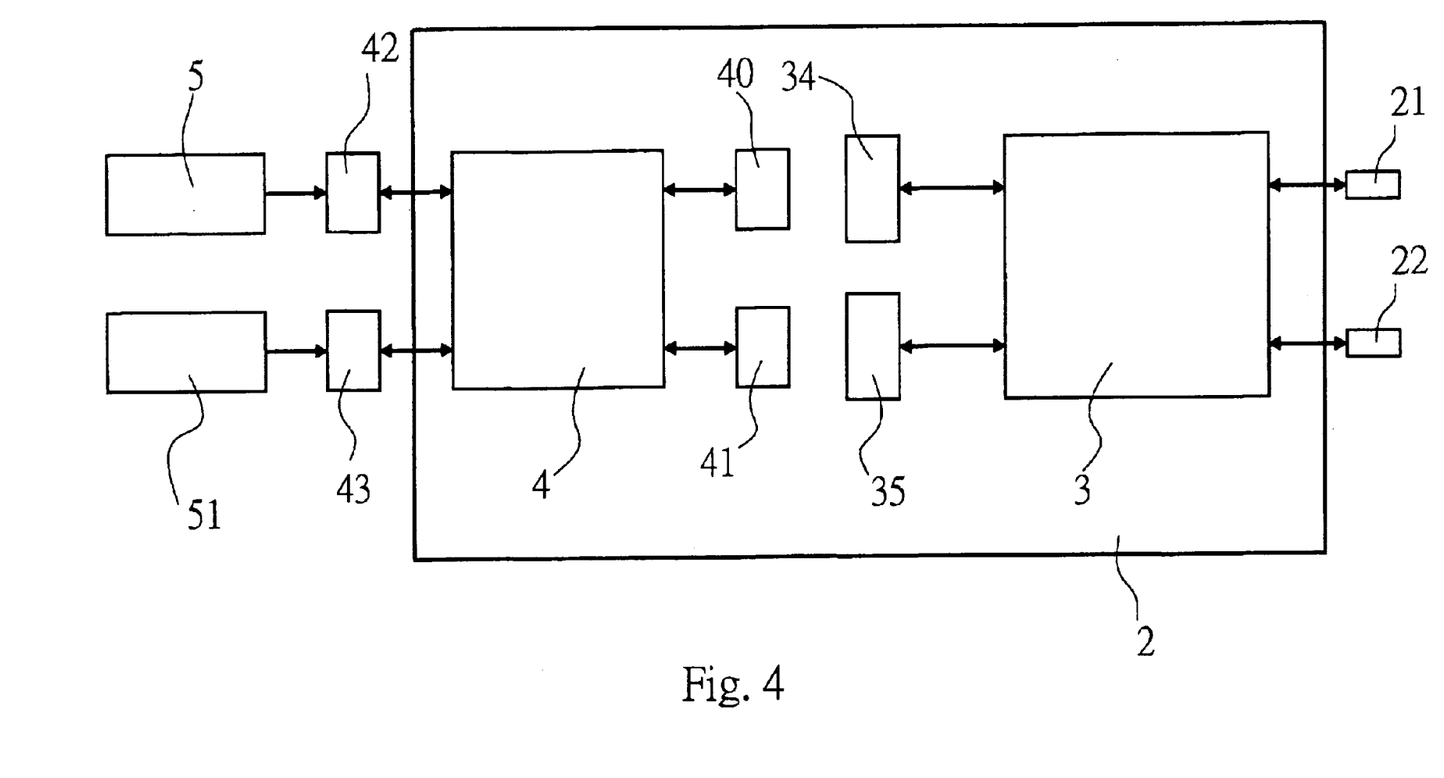
FIG. 4 is a block diagram showing the connection of the adapter box according to the present invention.

Moreover, in the present invention, a rear end of the adapter box 2 is installed with a 2×5 port 21 and an IEEE 1394 port 22 for connecting a mother board 60 (referring to FIGS. 4 and 5).

Figure 6:
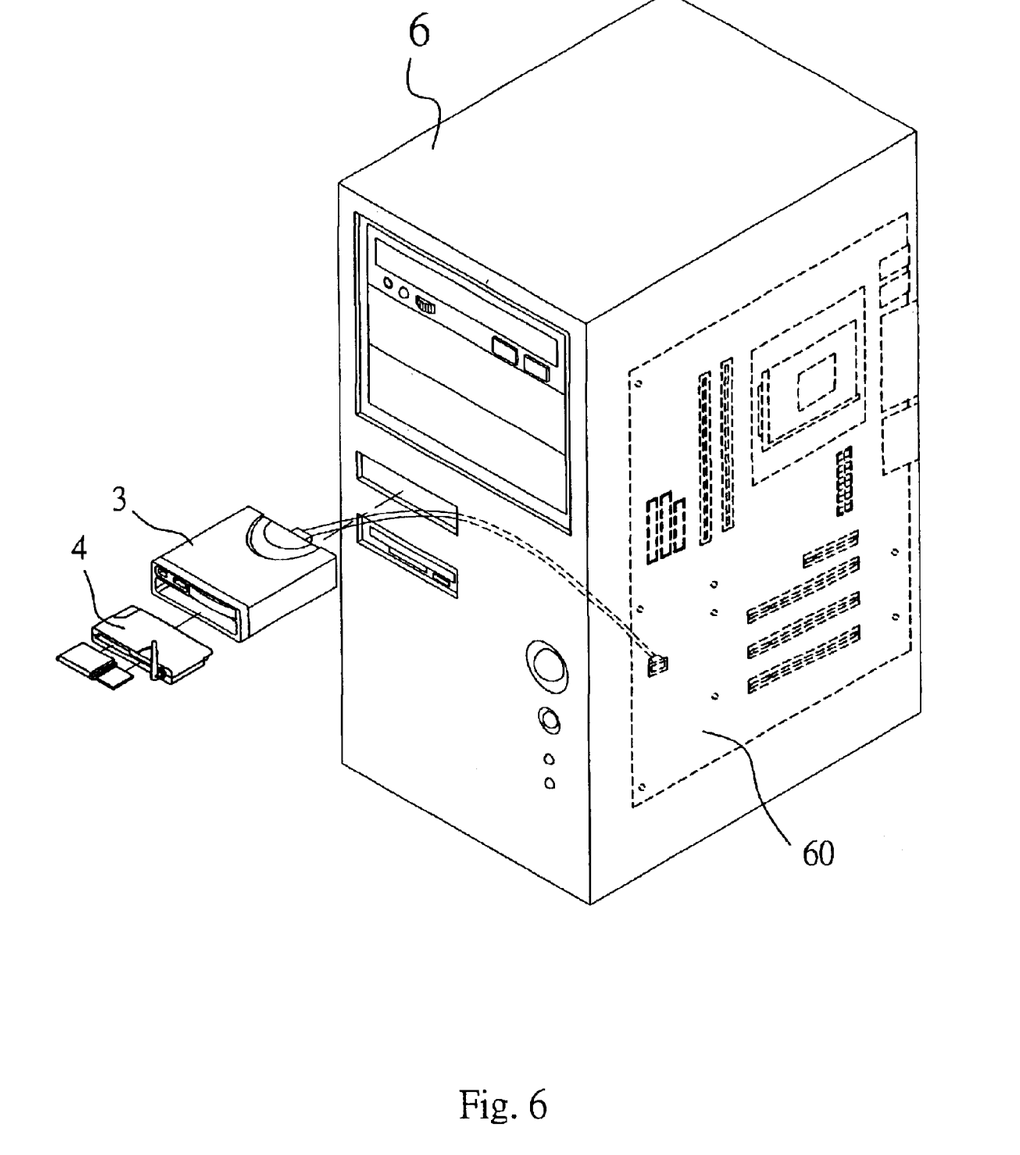
FIG. 6 shows one application of the present invention, wherein the adapter box of the present invention is applied to the desk top computer.
Figure 7:
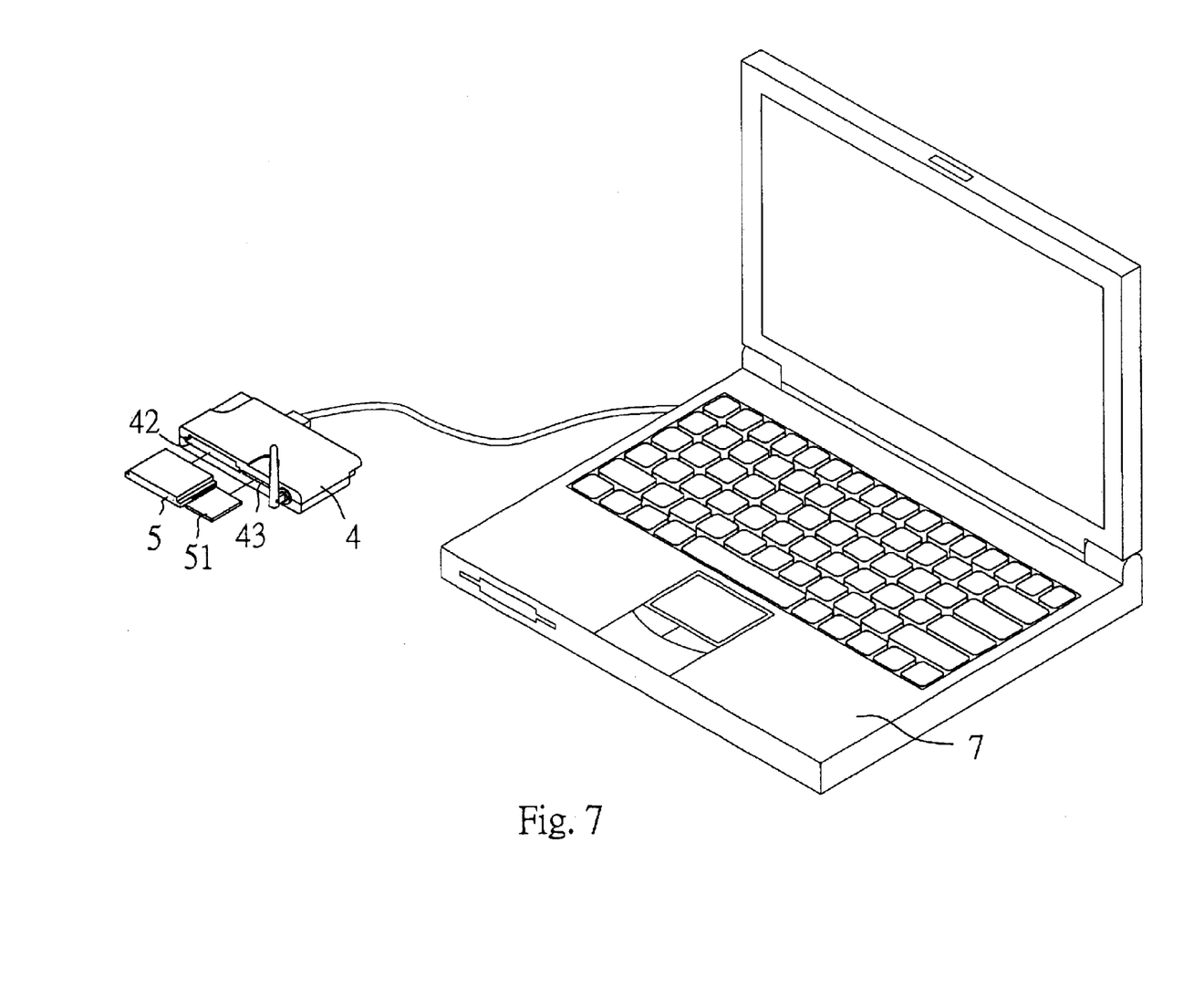
FIG. 7 is a schematic view showing the wireless extractable card reading router of the present invention is used to a notebook computer.
Figure 8:
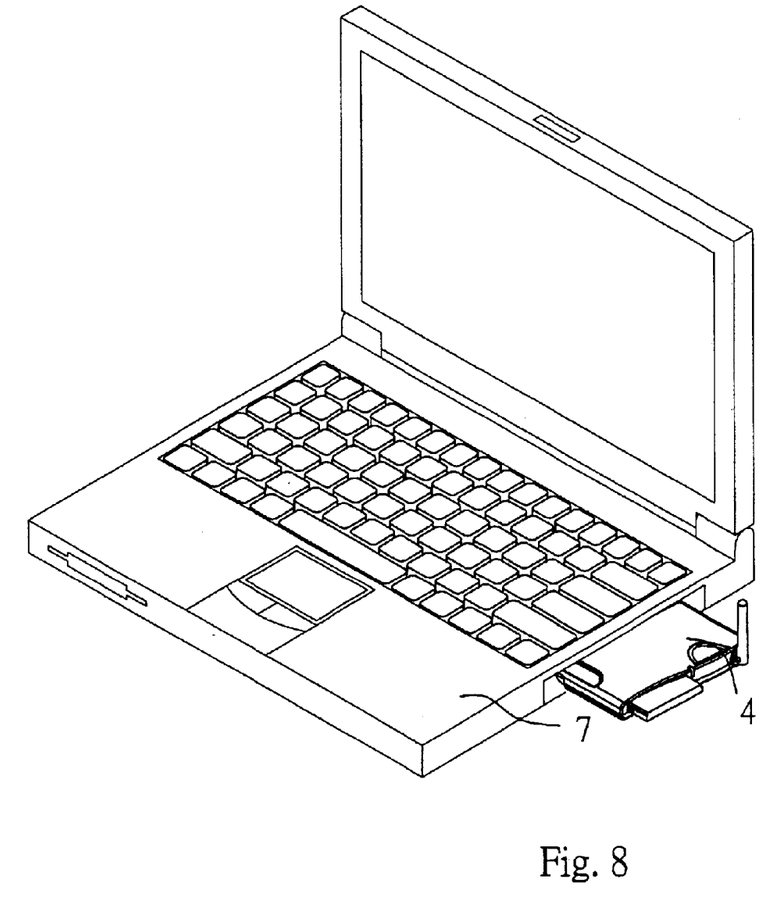
FIG. 8 shows that the adapter box of the present invention is used to a notebook computer.
Figure 9:
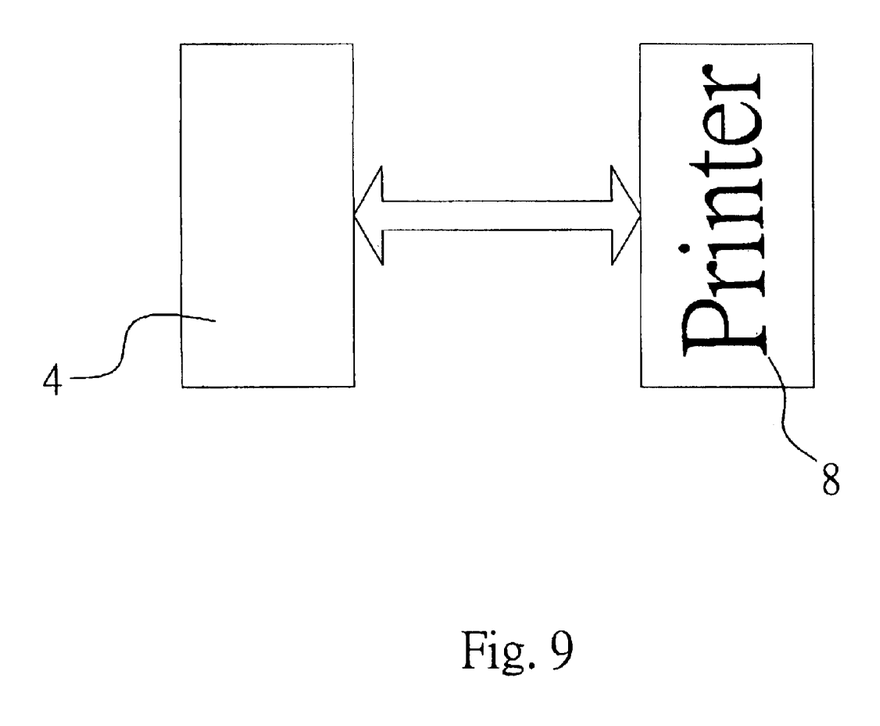
FIG. 9 shows another application of the present invention, where the present invention is realized to a printer.
Figure 10:
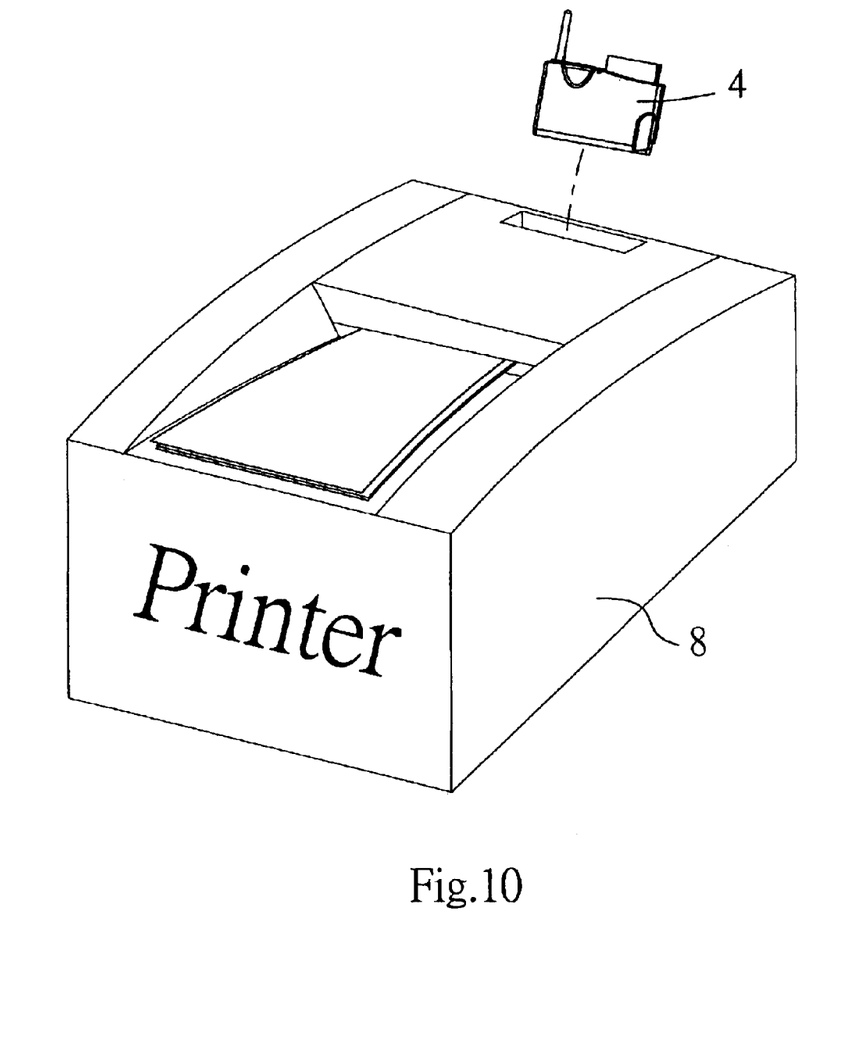
FIG. 10 is a schematic view showing that the wireless extractable card reading router of the present invention is applied to a printer.
Figure 11:
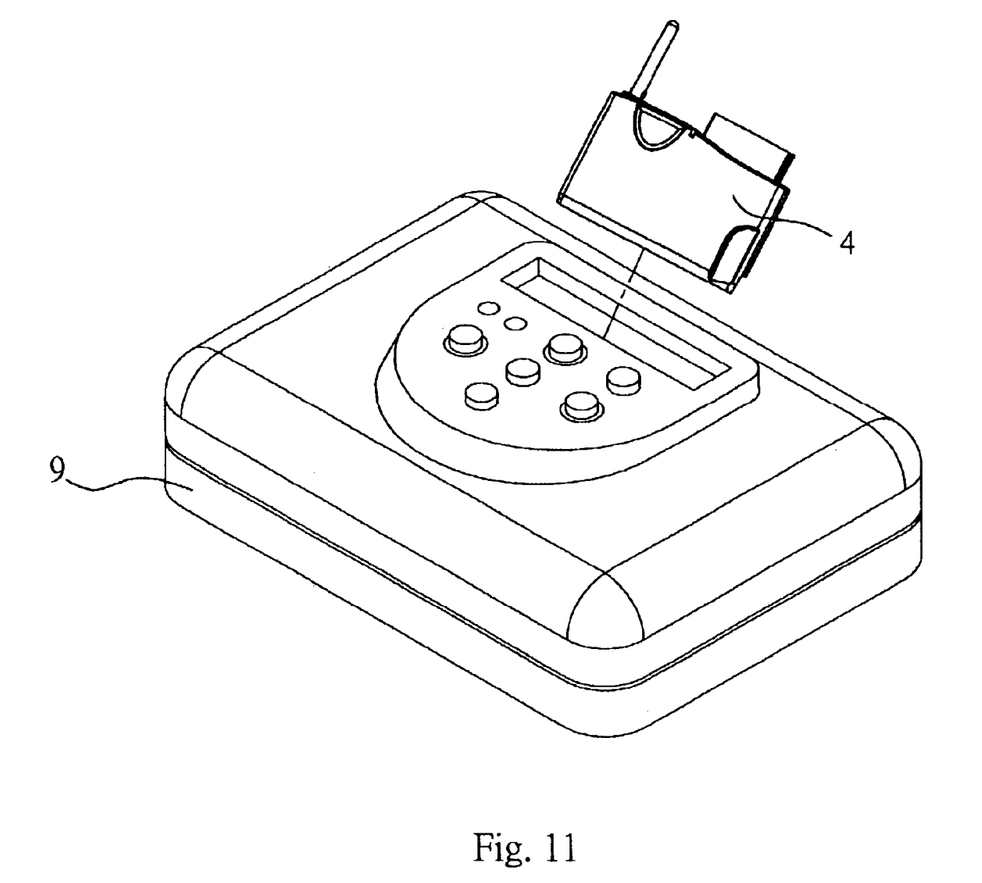
FIG. 11 shows one application of the present invention where the present invention is inserted to a wired router.

Further, the adapter box 2 can be used to the disk driver (3.5 inches or 5.25 inches) of a desk top computer through the ports 21, 22. Or the adapter box 2 is externally connected to a desk top computer 6 or a notebook computer 7 (referring to FIGS. 6, 7 and 8). Or the wireless extractable card reading router 4 is singly connected to a notebook computer 7, a printer 8 and a wired router 9 (referring to FIGS. 9, 10 and 11) so as to share the network resource.

Moreover the adapter box 2 can use an interface selected from one of a Blue Tooth transmission interface, IEEE 802.11A, IEEE802.11B, and IEEE802.11G standard interfaces. Thereby, the cost is low and connection distance is short. Portable computers, mobile phones, notebook computers, personal digital assistants, etc. can be used with the present invention. No any further connection wire is necessary.

Advantages of the present invention is that the extractable wide band router modular cartridge and wireless extractable card reading router are connected as an adapter box so that they can be carried easily. The adapter box can be connected to various devices for data transmission. The data can be printed through the present invention without needing any computer. The present invention can support wireless network standard interface. The present invention is an electrical plug-in device so as to be used conveniently.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A multifunctional extractable card reading modular cartridge connectable to a wireless broadband network router comprising: an adapter box an extractable wide band router modular cartridge installed in the adapter box and having two connecting terminals; the two connecting terminals of the extractable wide band router modular cartridge capable of being electrically connected to two connecting ports of a wireless extractable card reading router; characterized in that: a front end of adapter box further has a USB port and an IEEE 1304 port for connecting other external devices; the USB port and the IEEE 1304 port is extended into the extractable wide band router modular cartridge in the adapter box; and a rear end of the adapter box 2 is installed with a 2×5 port 21 and an IEEE 1394 port 22 for connecting external devices.

2. The multifunctional extractable card reading modular cartridge connectable to a wireless broad band network router as claimed in claim 1, wherein the wireless extractable card reading router has the two connecting ports at a distal end thereof.

3. The multifunctional extractable card reading modular cartridge connectable to a wireless broad band network router as claimed in claim 2, wherein the communication protocols of the connecting ports are high speed transmission USB transmission interface.

4. The multifunctional extractable card reading modular cartridge connectable to a wireless broad band network router as claimed in claim 2, wherein a front end of the wireless extractable card reading router has two slots for being inserted by memory cards; thereby, when the wireless extractable card reading router is inserted into the extractable wide band router modular cartridge, the data in the memory cards is transferred through the wireless extractable card reading router and the extractable wide band router modular cartridge.

5. The multifunctional extractable card reading modular cartridge connectable to a wireless broad band network router as claimed in claim 1, wherein the memory cards used is one of XD (Extreme Digital) cards, CF (Compact Flash) cards, MD (IBM, Micro drive) cards, SM (Smart Media) cards, MS (Memory Stick) cards, SD (Secure Digital) cards, MMC (Multi Media Card) cards.

* * * * *